United States Patent
Tsai et al.

(10) Patent No.: US 12,261,226 B2
(45) Date of Patent: Mar. 25, 2025

(54) TRANSISTOR DEVICES WITH MULTI-LAYER INTERLAYER DIELECTRIC STRUCTURES

(71) Applicant: Applied Materials, Inc., Santa Clara, CA (US)

(72) Inventors: Yun-Chu Tsai, San Jose, CA (US); Dejiu Fan, Mountain View, CA (US); Jung Bae Kim, San Jose, CA (US); Yang Ho Bae, San Jose, CA (US); Rodney Shunleong Lim, Daly City, CA (US); Dong Kil Yim, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 17/691,548

(22) Filed: Mar. 10, 2022

(65) Prior Publication Data
US 2023/0290883 A1   Sep. 14, 2023

(51) Int. Cl.
*H01L 21/00* (2006.01)
*H01L 29/66* (2006.01)
*H01L 29/786* (2006.01)

(52) U.S. Cl.
CPC .. *H01L 29/78696* (2013.01); *H01L 29/66742* (2013.01); *H01L 29/78618* (2013.01); *H01L 29/78672* (2013.01); *H01L 29/7869* (2013.01)

(58) Field of Classification Search
CPC ......... H01L 29/78696; H01L 29/66742; H01L 29/78618; H01L 29/78672; H01L 29/7869
See application file for complete search history.

(56) References Cited

U.S. PATENT DOCUMENTS

| 4,692,994 A * | 9/1987 | Moniwa | ............ H01L 29/66772 |
| | | | 257/353 |
| 6,624,450 B1 * | 9/2003 | Yamazaki | ......... H01L 29/78666 |
| | | | 257/E29.151 |

(Continued)

FOREIGN PATENT DOCUMENTS

| JP | H0778996 A | 3/1995 |
| KR | 1020160039040 A | 4/2016 |

OTHER PUBLICATIONS

PCT Notification of Transmittal of the International Search Report and the Written Opinion of the International Searching Authority for PCT Application No. PCT/US2023/014741, mailed Jun. 29, 2023, 11 pages.

*Primary Examiner* — Richard A Booth
(74) *Attorney, Agent, or Firm* — Lowenstein Sandler LLP (57) ABSTRACT

A transistor device includes a channel region, a first source/drain region adjacent to a first end of the channel region and a second source/drain region adjacent to a second end of the channel region, a gate structure disposed on the channel region, the first source/drain region and the second source/drain region, and an interlayer dielectric (ILD) structure disposed on the gate structure. The ILD structure includes a first dielectric layer including a first set of sublayers. The first set of sublayers includes a first sublayer including a first dielectric material having a first hydrogen concentration and a second sublayer including the first dielectric material having a second hydrogen concentration lower than the first hydrogen concentration. The ILD structure further includes a second dielectric layer including a second set of sublayers. The second set of sublayers includes a third sublayer including a second dielectric material different from the first dielectric material.

19 Claims, 4 Drawing Sheets

(56) References Cited

U.S. PATENT DOCUMENTS

| | | | |
|---|---|---|---|
| 7,098,087 B2 * | 8/2006 | Akimoto | H01L 21/02266 |
| | | | 438/164 |
| 9,177,975 B2 * | 11/2015 | Cho | H10K 59/8723 |
| 2003/0034497 A1 | 2/2003 | Yamazaki et al. | |
| 2009/0166766 A1 | 7/2009 | Lin | |
| 2015/0179448 A1 | 6/2015 | Lee et al. | |
| 2015/0243751 A1 | 8/2015 | Liu | |
| 2021/0066153 A1 | 3/2021 | Lim | |
| 2021/0296367 A1 * | 9/2021 | Seo | H01L 27/1225 |
| 2022/0005901 A1 * | 1/2022 | Tanaka | H01L 29/78618 |

* cited by examiner

TRANSISTOR DEVICES WITH MULTI-LAYER INTERLAYER DIELECTRIC STRUCTURES

TECHNICAL FIELD

The instant specification generally relates to electronic device fabrication. More specifically, the instant specification relates to transistor devices with multi-layer interlayer dielectric (ILD) structures.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates or wafers between the multiple chambers. In some instances, multiple substrates are transferred together. Process chambers may be used in an electronic device manufacturing apparatus to perform one or more processes on substrates, such as deposition processes and etch processes.

Processes for fabrication of electronic devices (e.g., semiconductor devices) generally include deposition of material (e.g., one or more thin film layers) on a substrate, and processing of the material. Deposition chamber systems, such as chemical vapor deposition (CVD) chamber systems, utilize process gases to perform a deposition process to deposit the material onto a substrate. Examples of CVD deposition processes include plasma enhanced (PE) CVD, thermally enhanced (TE) CVD, high density plasma (HDP) CVD, etc. To perform such CVD deposition processes, a substrate or wafer can be placed within a reactor chamber, and chemical vapors can be introduced into the reactor chamber that cause deposition of a particular material.

SUMMARY

In accordance with an embodiment, a transistor device is provided. The transistor device includes a channel region, a first source/drain region adjacent to a first end of the channel region and a second source/drain region adjacent to a second end of the channel region, a gate structure disposed on the channel region, the first source/drain region and the second source/drain region, and an interlayer dielectric (ILD) structure disposed on the gate structure. The ILD structure includes a first dielectric layer including a first set of sublayers. The first set of sublayers includes a first sublayer including a first dielectric material having a first hydrogen concentration and a second sublayer including the first dielectric material having a second hydrogen concentration lower than the first hydrogen concentration. The ILD structure further includes a second dielectric layer including a second set of sublayers. The second set of sublayers includes a third sublayer including a second dielectric material different from the first dielectric material.

In accordance with another embodiment, a semiconductor device is provided. The semiconductor device includes a first transistor device, a second transistor device and a capacitance storage device disposed between the first transistor device and the second transistor device. The first transistor device includes a channel region, a first source/drain region adjacent to a first end of the channel region and a second source/drain region adjacent to a second end of the channel region, a gate structure disposed on the channel region, the first source/drain region and the second source/ drain region, and an interlayer dielectric (ILD) structure disposed on the gate structure. The ILD structure includes a first dielectric layer including a first set of sublayers. The first set of sublayers includes a first sublayer including a first dielectric material having a first hydrogen concentration and a second sublayer including the first dielectric material having a second hydrogen concentration lower than the first hydrogen concentration. The ILD structure further includes a second dielectric layer including a second set of sublayers. The second set of sublayers includes a third sublayer including a second dielectric material different from the first dielectric material.

In accordance with yet another embodiment, a method for forming a semiconductor device is provided. The method includes forming a first dielectric layer of an interlayer dielectric (ILD) structure of a transistor device of the semiconductor device. Forming the first dielectric layer includes forming a first sublayer including a first dielectric material on a gate structure and forming a second sublayer including the first dielectric material on the first sublayer. Forming the first sublayer includes depositing the first dielectric material of the first sublayer at a first deposition rate, and forming the second sublayer includes depositing the first dielectric material of the second sublayer at a second deposition rate less than the first deposition rate. The method further includes forming a second dielectric layer of the ILD structure by forming a third sublayer including a second dielectric material on the first dielectric layer using a third deposition rate. The second dielectric material is different from the first dielectric material.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

A display, such an organic light emitting diode (OLED) display, can include a frontplane and a backplane. The frontplane is a layer including a number of pixels that generate images, and the backplane is a layer including switching circuitry having a number of components for controlling the pixels of the frontplane (e.g., an on/off state of the pixels). The switching circuitry can include an array of transistors. For example, the array of transistors can include an array of thin film transistors (TFTs). In some embodiments, the array of transistors has a hybrid transistor structure. For example, the array of transistors can be is a hybrid metal oxide transistor array (e.g., hybrid metal oxide TFT array).

One example of a backplane is a low-temperature polycrystalline silicon (LTPS) backplane. An LTPS backplane utilizes LTPS to form the transistors of the switching circuitry included within the backplane ("LTPS transistors"). LTPS backplanes may not allow for dynamic changes in refresh rates absent external hardware. Another example of a backplane is a low-temperature polycrystalline oxide (LTPO) backplane. An LTPO backplane can include an LTPO device. The LTPO device can include a switching circuitry component (e.g., LTPS transistor) to control a respective pixel of the frontplane, and a driving circuitry component of driving circuitry. The driving circuitry is used to drive the display. The use of the driving circuitry can provide for a more efficient display that enables dynamic changes in refresh rates without using external hardware.

In some embodiments, a transistor of the LTPO device can be field-effect transistor (FET) in which a channel region is disposed between a source region and a drain region. The channel region can be formed from a suitable semiconductor material, and the source region and the drain regions can be formed as respective doped regions each located at respective ends of the channel region. In some embodiments, the driving circuitry component of the LTPO device includes an oxide transistor in which the channel region is formed from an oxide semiconductor material. For example, the oxide semiconductor material can include indium-gallium-zin-oxide (IGZO) ("IGZO transistor"). A source contact can be formed on the source region and a drain contact formed on the drain region.

A gate structure of a FET can be disposed above the channel region. The channel region becomes conductive when the transistor is turned on. A threshold voltage of the FET is the minimum gate-to-source voltage that is sufficient to create a conducting path between the source region and the drain region. The gate structure can include a gate conductor including a conductive material, and a gate dielectric including a dielectric material disposed between the gate conductor and the source/drain/channel structure. Output current (e.g., source-drain current) is controlled by the voltage applied to the gate structure. Charge carriers can flow through the channel from the source region to the drain region.

An ILD structure can be formed between the gate conductor and the source and drain contacts. The ILD structure is used to insulate and/or electrically separate conductive lines arranged in a number of layers (or levels) of a semiconductor device (e.g., integrated circuit). Typically, the ILD structure of an oxide transistor of an LTPO device is formed using a single high deposition rate process that forms a single dielectric layer. However, in some transistor devices (e.g., oxide transistors of LTPO devices), yield loss has been observed when adopting high-quality ILD dielectric material under LTPS contact annealing. ILD structure cracks can cause shorted yield loss during clean processes (e.g., hydrogen fluoride (HF) clean processes) performed during the via hole cleaning. Moreover, hydrogen diffusion into and out of the channel region, resulting the formation of the ILD structure (e.g., single dielectric layer deposition and/or annealing), may shift the threshold voltage of the oxide transistor. Accordingly, ILD structures formed using conventional ILD structure deposition processes can lead to reduced LTPO device performance.

Aspects and implementations of the present disclosure address these and other shortcomings of existing technologies by providing for transistor devices with multi-layer interlayer dielectric (ILD) structures. A transistor device can be included within a semiconductor device. In some embodiments, the semiconductor device has a hybrid transistor structure. For example, the semiconductor device can be an LTPO device, and the transistor device can be an oxide transistor device (e.g., IGZO transistor device).

A multi-layer ILD structure described herein can include a number of dielectric layers, referred to as a dielectric stack. The dielectric stack can include any suitable number of dielectric layers. For example, a dielectric stack can include a first dielectric layer and a second dielectric layer. The first dielectric layer can include a first set of sublayers of a first dielectric material and the second dielectric layer can include a second set of sublayers of a second dielectric material. For example, the first set of sublayers can include a first sublayer and a second sublayer, and the second set of sublayers can include a single sublayer. In some embodiments, the first dielectric material is an oxide dielectric material (e.g., each of the first and second sublayers is an oxide dielectric material layer). One example of an oxide dielectric material is silicon oxide ($SiO_x$). In some embodiments, the second dielectric material is a nitride dielectric material (e.g., the single sublayer is a nitride dielectric material layer). One example of a nitride dielectric material is silicon nitride ($Si_xN_y$). However, such embodiments should not be considered limiting, and any suitable dielectric materials can be used to form the multi-layer ILD structure in accordance with the embodiments described herein.

Forming the ILD structure can include forming the first set of sublayers including the first dielectric material, and forming the second set of sublayers including the second dielectric material on the first set of sublayers. The dielectric layers of the multi-layer ILD structure described herein can be formed using different depositions rates. A higher deposition rate correlates to a greater hydrogen concentration formed within the dielectric material, whereas a lower deposition rate correlates to a lower hydrogen concentration formed within the dielectric material.

The first sublayer of the first dielectric layer can be formed as a hydrogen diffusion source for the channel region (e.g., IGZO contact area). For example, the first sublayer can be formed having a high hydrogen concentration by depositing the first dielectric material using a high deposition rate. A high deposition rate can refer to a deposition rate of greater than or equal to about 1,500 Angstroms per minute. The second sublayer of the first dielectric layer can be formed as a hydrogen barrier. For example, the second sublayer can be formed having a low hydrogen concentration by depositing the first dielectric material using a low deposition rate. A low deposition rate can refer to a deposition rate of less than about 800 Angstroms per minute. The first and second sublayers of the first set of sublayers can each be formed to have a thickness ranging from about 1,000 Angstroms to about 3,000 Angstroms.

The second dielectric layer can be deposited on the first dielectric layer to provide passivation ability with respect to, e.g., moisture, hydrogen diffusion, and/or ambient effects. Thus, the single sublayer of the second dielectric layer can be formed by depositing the second dielectric material using a suitable deposition rate to provide sufficient passivation ability. For example, the single sublayer of the second dielectric layer can be formed using a medium deposition rate. A medium deposition rate can refer to a deposition rate of between about 700 Angstroms per minute to about 1,500 Angstroms per minute. A high temperature (e.g., greater than or equal to about 300° C.) deposition process can be used to form the second dielectric layer (e.g., sublayer including silicon nitride material) over the first dielectric layer.

Hydrogen is one of carrier sources inside of the channel region. Thus, as more hydrogen diffuses into the channel region, more carriers will be introduced into the channel region will become more carriers, increasing the conductivity of the channel region. As a hydrogen diffusion layer, the first sublayer can ensure that the electrode/channel contact area has less contact resistance (e.g., more hydrogen diffusion on the channel layer can lead to a more conductive channel). As a hydrogen barrier layer, the second sublayer can act as a protection layer to block excess hydrogen sources from the second dielectric layer. For example, if the first dielectric material is silicon oxide and the second dielectric material is silicon nitride, silicon nitride can have at least 10 times the hydrogen content as compared to silicon oxide.

As described above, the multi-layer ILD structures described herein can provide a barrier against hydrogen diffusion. Since the second dielectric layer (e.g., single sublayer) can provide passivation ability, the multi-layer ILD structure described herein can enable removal of passivation layer deposition and thus improve tact time in semiconductor device fabrication. Moreover, the deposition sequence used to form the multi-layer ILD structures described herein can address contact annealing issues. The multi-layer ILD structures described herein can address the ILD cracking issue that can lead to shorted yield loss defects observed during cleaning processes (e.g., ILD via hole wet-clean processes). Accordingly, the multi-layer ILD structure described here can enable more precise tuning of oxide transistor properties with respect to, for example, source/drain contacts and main channel conductance. Further details regarding the formation of the semiconductor device will now be described below with reference to FIGS. 1-3B.

Figure 1:
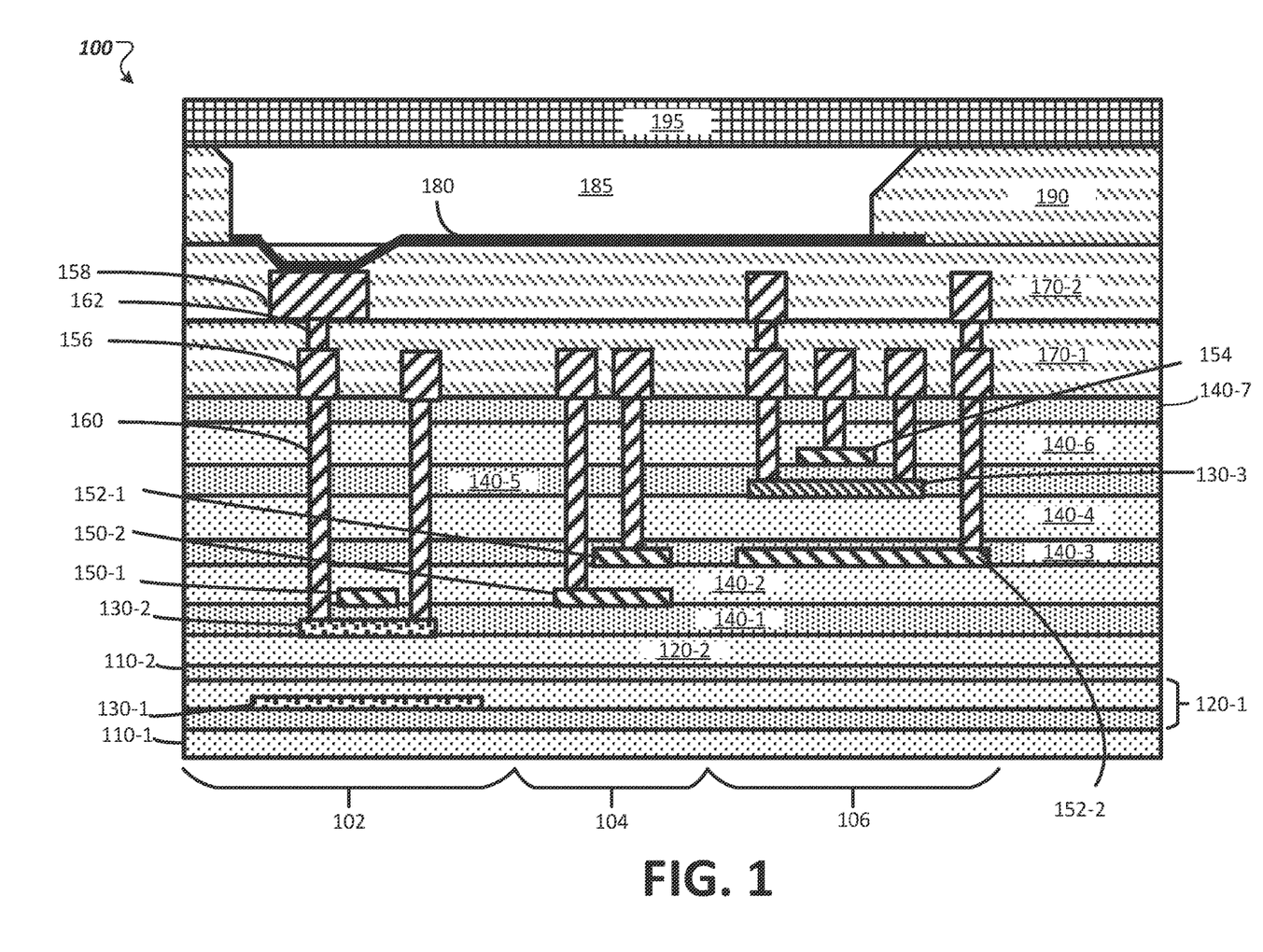
FIG. 1 is a cross-sectional view of an example semiconductor device including a hybrid transistor structure, in accordance with some embodiments.

Aspects and implementations of the present disclosure provide for a multi-layer ILD structure, which can include multiple oxide dielectric material layers with different qualities, that can support high temperature (e.g., greater than about 300° C.) depo FIG. 1 is a cross-sectional view of an example semiconductor device 100, in accordance with some embodiments. As shown, the semiconductor device 100 includes a number of devices 102, 104 and 106. Devices 102 and 106 can be transistor devices, and device 104 can be a capacitance storage device. Thus, the semiconductor device 100 has a hybrid transistor structure (e.g., a hybrid TFT structure). In some embodiments, the semiconductor device 100 is an LTPO device. For example, the device 102 can be an LTPS transistor device (e.g., LTPS TFT device), the device 104 can be a capacitance storage device, and the device 106 can be an oxide transistor device (e.g., oxide TFT device). In some embodiments, the device 106 is an IGZO TFT device.

The semiconductor device 100 includes passivation layers 110-1 and 110-2, a buffer layer 120-1 disposed between the passivation layers 110-1 and 110-2, and a buffer layer 120-2 disposed on the passivation layer 110-2. In some embodiments, the passivation layers 110-1 and 110-2 each include a polyimide (PI) material. The buffer layers 120-1 and 120-2 can include any number of sublayers. In this illustrative example, the buffer layer 120-1 includes two sublayers and the buffer layer 120-1 includes a single layer. The buffer layers 120-1 and 120-2 can include any suitable dielectric material(s) in accordance with embodiments described herein. In some embodiments, at least one of the buffer layers 120-1 or 120-2 includes an oxide material. For example, at least one of the buffer layers 120-1 or 120-2 can include silicon oxide (e.g. $SiO_x$). In some embodiments, at least one of the buffer layers 120-1 or 120-2 includes a nitride material. For example, at least one of the buffer layers 120-1 or 120-2 can include silicon nitride (e.g. $Si_xN_y$).

As further shown, a semiconductor layer 130-1 is formed within the buffer layer 120-1 and a semiconductor layer 130-2 is formed on the buffer layer 120-2. Each of the semiconductor layers 130-1 and 130-2 is a component of the device 102. Each of the semiconductor layers 130-1 and 130-2 can be formed by depositing semiconductor material using a respective epitaxial growth process. The semiconductor layer 130-1 can be a backside shielding layer (BSL), and the semiconductor layer 130-2 can include a channel region and source/drain regions of a transistor. The semiconductor layers 130-1 and 130-2 can include any suitable materials in accordance with embodiments described herein. For example, the semiconductor layer 130-1 can include a non-crystalline form of silicon (Si) (e.g., amorphous silicon (a-SI)), and the semiconductor layer 130-2 can include a crystalline form of Si (e.g., polycrystalline silicon (p-SI)).

As further shown, a dielectric layer 140-1 is formed over the semiconductor layer 130-2 and the buffer layer 120-2, and a conductive layer 150-1 and a conductive layer 150-2 are formed on the dielectric layer 140-1. Forming the conductive layers 150-1 and 150-2 can include depositing a conductive material, and etching the conductive material to form the conductive layers 150-1 and 150-2 using an etch mask. The dielectric layer 140-1 serves as a gate dielectric for the device 102, the conductive layer 150-1 serves as a gate conductor for the device 102, and the conductive layer 150-2 serves as a conductive layer for the device 104. The conductive layers 150-1 and 150-2 can be located in a first metallization level of the semiconductor device 100 (denoted "M1"). The conductive layer 150-1 is a component of the device 102 and the conductive layer 150-2 is a component of the device 104. The dielectric layer 140-1 can include any suitable material in accordance with embodiments described herein. In some embodiments, the dielectric layer 140-1 includes an oxide material. For example, at the dielectric layer 140-1 can include silicon oxide (e.g. $SiO_x$). The conductive layers 150-1 and 150-2 can include any suitable conductive material(s) in accordance with embodiments described herein. In some embodiments, at least one of the conductive layers 150-1 or 150-2 includes a metal material. For example, at least one of the conductive layers 150-1 or 150-2 can include at least one of copper (Cu), silver (Ag), gold (Au), aluminum (Al), zinc (Zn), nickel (Ni), titanium (Ti), molybdenum (Mo), etc.

As further shown, a dielectric layer 140-2 is formed over the conductive layers 150-1 and 150-2 and the dielectric layer 140-1, and a conductive layer 152-1 and a conductive layer 152-2 are formed on the dielectric layer 140-2. Forming the conductive layers 152-1 and 152-2 can include depositing a conductive material, and etching the conductive material to form the conductive layers 150-1 and 150-2 using an etch mask. The conductive layer 152-1 serves as another conductive layer for the device 104, and the conductive layer 152-2 serves as a conductive layer for the device 106. The conductive layer 152-1 serves as another conductive layer for the device 104, and the conductive layer 152-2 serves as a conductive layer for the device 106. The conductive layers 152-1 and 152-2 can be located in a second metallization level of the semiconductor device 100 (denoted "M2"). The dielectric layer 140-2 can include suitable material in accordance with embodiments described herein. In some embodiments, the dielectric layer 140-2 includes an oxide material. For example, the dielectric layer 140-2 can include silicon oxide (e.g. $SiO_x$). In some embodiments, the dielectric layer 140-2 includes a nitride material. For example, the dielectric layer 140-2 can include silicon oxide (e.g. $Si_xN_y$). The conductive layers 152-1 and 152-2 can include any suitable conductive material(s) in accordance with embodiments described herein. In some embodiments, at least one of the conductive layers 152-1 or 152-2 includes a metal material. For example, at least one of the conductive layers 152-1 or 152-2 can include at least one of copper (Cu), silver (Ag), gold (Au), aluminum (Al), zinc (Zn), nickel (Ni), titanium (Ti), molybdenum (Mo), etc.

As further shown, a dielectric layer 140-3 is formed over the conductive layers 152-1 and 152-2 and the dielectric layer 140-2, and a dielectric layer 140-4 is formed over the dielectric layer 140-3. As will be described in further detail below with reference to FIG. 2, the dielectric layers 140-3 and 140-4 can collectively form a buffer layer for the device 106. In some embodiments, at least one of the dielectric layers 140-3 and 140-4 includes an oxide material. For example, at least one of the dielectric layers 140-3 and 140-4 can include silicon oxide (e.g. $SiO_x$). In some embodiments, at least one of the dielectric layers 140-3 and 140-4 includes a nitride material. For example, at least one of the dielectric layers 140-3 and 140-4 can include silicon nitride (e.g. $Si_xN_y$).

As further shown, a semiconductor layer 130-3 is formed on the dielectric layer 140-4, and a dielectric layer 140-5 is formed over the semiconductor layer 130-3 and the dielectric layer 140-4. The semiconductor layer 130-3 can include a channel region and source/drain regions of a transistor and the dielectric layer 140-5 can be a gate dielectric, as will be described in further detail below with reference to FIG. 2. The dielectric layer 140-5 can include any suitable material in accordance with embodiments described herein. In some embodiments, dielectric layer 140-5 includes an oxide material. For example, dielectric layer 140-5 can include silicon oxide (e.g. $SiO_x$). In some embodiments, dielectric layer 140-5 includes a nitride material. For example, dielectric layer 140-5 can include silicon nitride (e.g. $Si_xN_y$). The semiconductor layer 130-3 can include any suitable semiconductor material in accordance with embodiments described herein. In some embodiments, the semiconductor layer 130-3 is an oxide semiconductor material. For example, the semiconductor layer 130-3 can include IGZO (e.g., an IGZO channel region).

As further shown, a conductive layer 154 is formed over the dielectric layer 140-5, a dielectric layer 140-6 is formed over the conductive layer 154 and the dielectric layer 140-4, and a dielectric layer 140-7 is formed over the dielectric layer 140-6. Forming the conductive layers 154 can include depositing a conductive material, and etching the conductive material to form the conductive layer 154 using an etch mask. The conductive layer 154 can be a gate conductor, and the gate conductor and the gate dielectric can collectively form a gate structure, as will be described in further detail below with reference to FIG. 2. The conductive layer 154 can be located in a third metallization level of the semiconductor device 100 (denoted "M3"). The dielectric layers 140-5 through 140-7 can each include any suitable material in accordance with embodiments described herein. The conductive layer 154 can include any suitable conductive material in accordance with embodiments described herein. In some embodiments, the conductive layer 154 includes a metal material. For example, the conductive layer 154 can include at least one of copper (Cu), silver (Ag), gold (Au), aluminum (Al), zinc (Zn), nickel (Ni), titanium (Ti), molybdenum (Mo), etc.

The dielectric layers 140-6 and 140-7 can form a dielectric stack of a multi-layer ILD structure of the device 106. The dielectric layer 140-6 can include first set of sublayers of a first dielectric material, and the dielectric layer 140-7 can include a second set of sublayers of a second dielectric material. For example, the first set of sublayers can include a first sublayer and a second sublayer, and the second set of sublayers can include a single sublayer. In some embodiments, the first dielectric material is an oxide dielectric material (e.g., each of the first and second sublayers is an oxide dielectric material layer). One example of an oxide dielectric material is silicon oxide ($SiO_x$). In some embodiments, the second dielectric material is a nitride dielectric material (e.g., the single sublayer is a nitride dielectric material layer). One example of a nitride dielectric material is silicon nitride ($Si_xN_y$). However, such embodiments should not be considered limiting, and any suitable dielectric materials can be used to form the multi-layer ILD structure in accordance with the embodiments described herein.

The sublayers of the dielectric layers 140-6 and 140-7 can be formed using various deposition rates. By doing so, the multi-layer ILD structure formed by the dielectric layers 140-6 and 140-7 can form a barrier against hydrogen diffusion and can provide passivation ability with respect to, e.g., moisture, hydrogen diffusion, and/or ambient effects. A higher deposition rate correlates to a greater hydrogen concentration formed within the dielectric material, whereas a lower deposition rate correlates to a lower hydrogen concentration formed within the dielectric material.

For example, a first sublayer of the dielectric layer 140-6 can be formed as a hydrogen diffusion source for the channel region (e.g., IGZO contact area) using a high deposition rate. A high deposition rate can refer to a deposition rate of greater than or equal to about 1,500 Angstroms per minute. A second sublayer of the dielectric layer 140-6 can be formed as a hydrogen barrier using a low deposition rate. A low deposition rate can refer to a deposition rate of less than about 1,500 Angstroms per minute (e.g., less than about 800 Angstroms per minute). The first and second sublayers of the first set of sublayers can each be formed to have a thickness ranging from about 1,000 Angstroms to about 3,000 Angstroms.

The dielectric layer 140-7 (e.g., the single sublayer) can be deposited on the dielectric layer 140-6 to provide the passivation ability. Thus, the single sublayer of the second dielectric layer can be formed by depositing the second dielectric material using a suitable deposition rate to provide sufficient passivation ability. For example, the single sublayer of the second dielectric layer can be formed using a medium deposition rate (e.g., between about 700 Angstroms per minute to about 1,500 Angstroms per minute).

Hydrogen is one of carrier sources inside of the channel region 230. Thus, as more hydrogen diffuses into the channel region, more carriers will be introduced into the channel region will become more carriers, increasing the conductivity of the channel region. As a hydrogen diffusion layer, the first sublayer of the dielectric layer 140-6 can ensure that the electrode/channel contact area has less contact resistance (e.g., more hydrogen diffusion on the channel layer can lead to a more conductive channel). As a hydrogen barrier layer, the second sublayer of the dielectric layer 140-6 can act as a protection layer to block excess hydrogen sources from the dielectric layer 140-7. For example, if the first dielectric material is silicon oxide and the second dielectric material is silicon nitride, silicon nitride can have at least 10 times the hydrogen content as compared to silicon oxide. Further details regarding the multi-layer ILD structure of the device 106 are described below with reference to FIGS. 2-3.

As further shown, a number of conductive lines, or vias, 160 are formed through dielectric material to be in contact with respective ones of the semiconductor layers 130-2 and 130-3 and conductive layers 150-2, 152-1, 152-2 and 154, and a number of conductive layers 156 are each formed on a respective one of the vias. A via is a conductive structure used to electrically connect layers located within different metallization levels. For example, a pair of vias can be formed in contact with the semiconductor layer 130-2 (e.g., the source/drain regions of the semiconductor layer 130-2), a via can be formed in contact with the conductive layer 150-2, a via can be formed in contact with the conductive layer 152-1, a via can be formed in contact with the conductive layer 152-2, a pair of vias can be formed in contact with the semiconductor layer 130-3 (e.g., the source/drain regions of the semiconductor layer 130-3), and a via can be formed in contact with the conductive layer 154. Forming each of the vias 160 can include forming a through hole through a respective number of layers to expose its corresponding semiconductor layer or conductive layer, and depositing a conductive material within the through hole. Forming the conductive layers 156 can include depositing a conductive material, and etching the conductive material to form the conductive layers 156 using an etch mask. The conductive layer in electrical communication with the conductive layer 154 can be a gate contact. The conductive layers that are in electrical communication with the semiconductor layers 130-2 and 130-3 can each be included within a source contact or a drain contact, as will be described in further detail below with reference to FIG. 2. The conductive layers 156 can be located in a fourth metallization level of the semiconductor device 100 (denoted "M4"). The vias 160 and/or the conductive layers 156 can include any suitable conductive material(s) in accordance with embodiments described herein. In some embodiments, at least one of the vias 160 and/or conductive layers 156 includes a metal material. For example, at least one of the vias 160 and/or conductive layers 156 can include at least one of copper (Cu), silver (Ag), gold (Au), aluminum (Al), zinc (Zn), nickel (Ni), titanium (Ti), molybdenum (Mo), etc.

In this illustrative example, each of the transistor devices 102 and 106 has a planar transistor structure in which the source, drain and channel regions are arranged in a horizontal configuration. Additionally or alternatively, at least one of the transistor devices 102 or 106 can be a fin field-effect transistor device (FinFET) in which the gate structure is placed along multiple sides of the channel region (e.g., wrapped around the channel region). That is, a FinFET can be referred to as a multi-gate device. Alternatively, at least one of the transistor devices 102 or 106 can be a vertical transistor device (e.g., vertical FET (VFET) or vertical transport FET (VTFET)) in which the source, drain and channel regions are arranged in a vertical configuration.

As further shown, a planarization layer 170-1 is formed over the conductive layers 156, and a number of vias 162 are formed through the planarization layer 170-1 in contact with respective ones of the conductive layers 156 of the device 102 and the device 106. Forming each of the vias 162 can include forming a through hole through the planarization layer 170-1 to expose its corresponding conductive layer, and depositing a conductive material within the through hole. The vias 162 can include any suitable conductive material(s) in accordance with embodiments described herein. In some embodiments, at least one of the vias 162 includes a metal material. For example, at least one of the vias 162 can include at least one of copper (Cu), silver (Ag), gold (Au), aluminum (Al), zinc (Zn), nickel (Ni), titanium (Ti), molybdenum (Mo), etc. The planarization layer 170-1 can include any suitable material in accordance with embodiments described herein. For example, the planarization layer 170-1 can include a polymer coating.

As further shown, a number of conductive layers 158 are formed on respective ones of the vias 162, and a planarization layer 170-2 is formed on the conductive layers 158 and across the planarization layer 170-1. Forming the conductive layers 158 can include depositing a conductive material, and etching the conductive material to form the conductive layers 158 using an etch mask. The conductive layers 158 can include any suitable conductive material(s) in accordance with embodiments described herein. In some embodiments, at least one of the conductive layers 158 includes a metal material. For example, at least one of the conductive layers 158 can include at least one of copper (Cu), silver (Ag), gold (Au), aluminum (Al), zinc (Zn), nickel (Ni), titanium (Ti), molybdenum (Mo), etc. The conductive layer 158 of the device 102 can be referred to as an anode layer. The planarization layer 170-2 can include any suitable material in accordance with embodiments described herein. For example, the planarization layer 170-2 can include a polymer coating.

As further shown, a cathode layer 180 is formed across the planarization layer 170-2 and in contact with the conductive layer 158 of the device 102, and a pixel definition layer (PDL) 190 is formed along portions of the cathode layer 180 and the planarization layer 170-2. PDL 190 defines a pixel opening region 185. PDL 190 can include any suitable material in accordance with embodiments described herein. For example, PDL 190 can include a photoresist material. The photoresist material can have a black pigment. Moreover, an OLED layer 195 is formed across the PDL 190. Other structures of the semiconductor device 100 have been omitted for simplicity. Examples of such other structures include a driving electrode (Tx), a sensing electrode (Rx), additional planarization layers (e.g., organic planarization layers), etc. Further details regarding the device 106 will now be described below with reference to FIG. 2.

Figure 2:
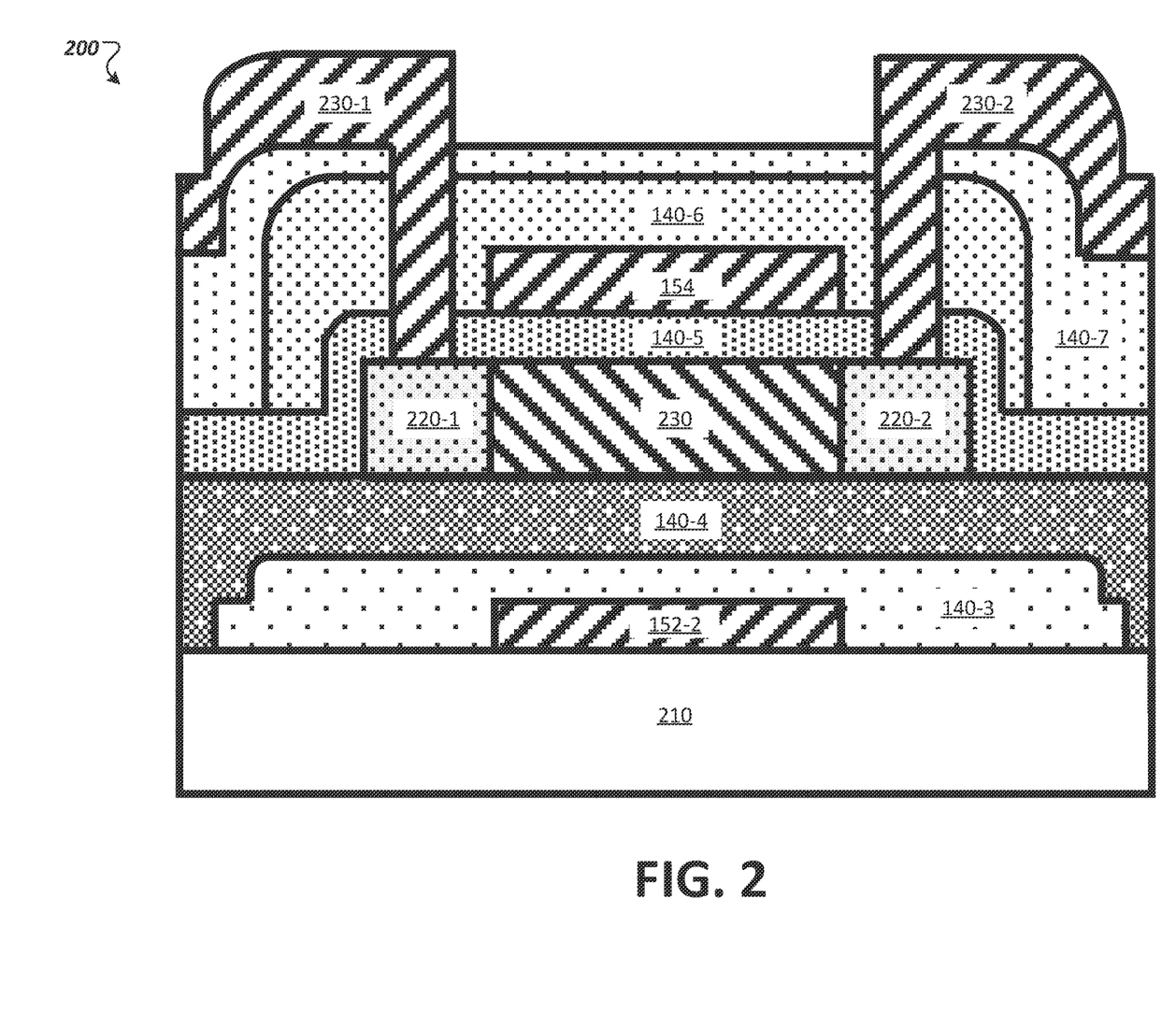
FIG. 2 is cross-sectional view of an example transistor device with a multi-layer interlayer dielectric (ILD) structure, in accordance with some embodiments.

FIG. 2 is a cross-sectional view of a transistor device 200 with a multi-layer interlayer dielectric (ILD) structure, in accordance with some embodiments. In some embodiments, the transistor device 200 is a thin film transistor device (TFT). However, the transistor device 200 can be any suitable semiconductor device in accordance with embodiments described herein. The transistor device 200 can be included within a semiconductor device, such as the semiconductor device 100 described above with reference to FIG. 1 (e.g., transistor device 130).

As shown in FIG. 2, the transistor device 200 includes a base structure 210 having multiple layers formed thereon, including conductive layer (e.g., gate conductor) 152-2 described above with reference to FIG. 1. The base structure 210 can include any suitable substrate structure, e.g., a bulk semiconductor, a semiconductor-on-insulator (SOI) substrate, etc. In one example, the base structure 210 can include a silicon-containing material. Illustrative examples of Si-containing materials suitable for the substrate 210 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. For example, the base structure 210 can include the layers disposed below the conductive layer 152-2 as shown in FIG. 1.

As further shown, the transistor device 200 further includes a dielectric layer 140-3 formed on the base structure 210, and a dielectric layer 140-4 formed on the dielectric layer 140-3, as described above with reference to FIG. 1. For example, the dielectric layers 140-3 and 140-4 can collectively form a buffer layer of the transistor device 200. The dielectric layers 140-3 and 140-4 can include any suitable dielectric materials in accordance with embodiments described herein. In some embodiments, the dielectric layer 140-3 includes a first dielectric material and the dielectric layer 140-4 includes a second dielectric material different from the first dielectric material. For example, the dielectric layer 140-3 can include a nitride material (e.g. $Si_xN_y$) and the dielectric layer 140-4 can include an oxide material (e.g., $SiO_x$). Although the buffer layer of the transistor device 200 is shown in this illustrative example including two dielectric layers, the buffer layer of the transistor device 200 can include any suitable number of dielectric layers in accordance with embodiments described herein.

As further shown, the transistor device 200 further includes source/drain regions 220-1 and 220-2 each located at a respective end of a channel region 230. The source/drain regions 220-1 and 220-2 and the channel region 230 can correspond to the semiconductor material 130-3 described above with reference to FIG. 1. The source/drain regions 220-1 and 220-2 and the channel region 230 can include any suitable semiconductor material(s) in accordance with embodiments described herein. In some embodiments, the channel region 230 includes an oxide semiconductor material. For example, the channel region 230 can include IGZO.

As further shown, the transistor device 200 further includes the dielectric layer 140-5 and the conductive layer 154. More specifically, the dielectric layer 140-5 forms a gate dielectric and the conductive layer 154 forms a gate conductor, which collectively form a gate structure of the transistor device 200. Further details regarding the dielectric layer 140-5 and the conductive layer 154 are described above with reference to FIG. 1.

In this illustrative example, the transistor device 200 has a planar transistor structure in which the source, drain and channel regions are arranged in a horizontal configuration. Additionally or alternatively, the transistor device 200 can be a FinFET (e.g., a multi-gate device). Alternatively, the transistor device 200 can be a VFET or VTFET.

As further shown, the transistor device 200 further includes source/drain contacts 230-1 and 230-2 each in contact with a respective one of the source/drain regions 220-1 and 220-2. Each of the source/drain contacts 230-1 and 230-2 can include a via and a conductive layer (e.g., a via 160 and a conductive layer 156 as described above with reference to FIG. 1).

As further shown, the transistor device 200 further includes a dielectric layers 140-6 and 140-7, which form a multi-layer ILD structure. As described above with reference to FIG. 1, the dielectric layer 140-6 can include first set of sublayers of a first dielectric material (e.g., silicon oxide), and the dielectric layer 140-7 includes a second set of sublayers of a second dielectric material (e.g., silicon nitride). For example, the dielectric layer 140-6 can include a first sublayer formed as a hydrogen diffusion source for the channel region 230 by being deposited using a high deposition rate (e.g., greater than or equal to about 1,500 Angstroms per minute, and a second sublayer formed as a hydrogen barrier by being deposited using a low deposition rate (e.g., less than about 800 Angstroms per minute). Moreover, the dielectric layer 140-7 can include a single sublayer formed to provide passivation ability by being deposited using a medium deposition rate (e.g., between about 700 Angstroms per minute to about 1,500 Angstroms per minute). Further details regarding the formation of the transistor device 200, including the multi-ILD structure, are described above with reference to FIG. 1 and will now be described below with reference to FIGS. 3A-3B.

Figure 3A:
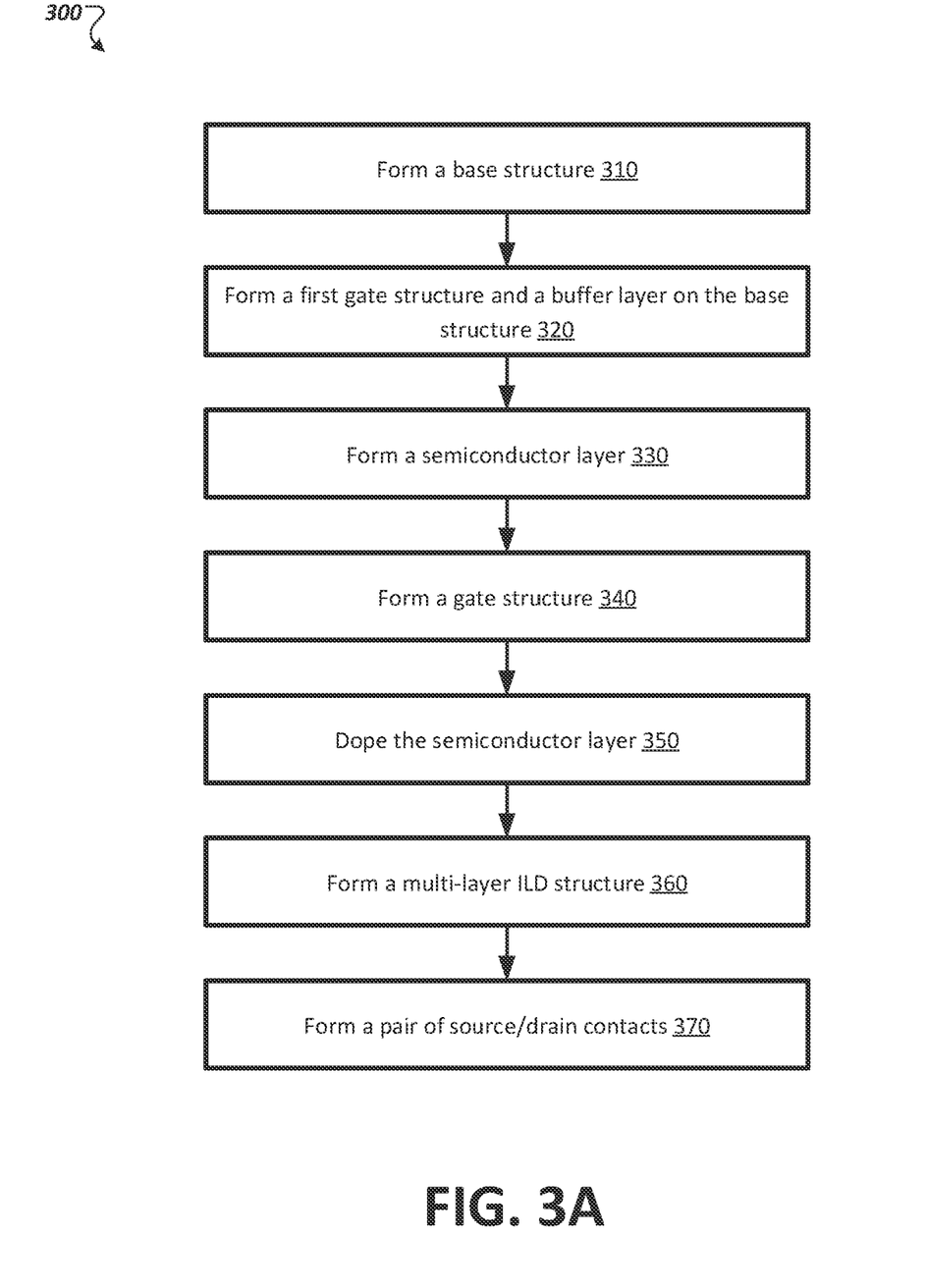
FIGS. 3A-3B are flowcharts of example methods for fabricating a transistor device with a multi-layer interlayer dielectric (ILD structure), in accordance with some embodiments.

FIG. 3A depicts a flowchart of an example method 300 for fabricating a transistor device with a multi-layer interlayer dielectric (ILD structure), in accordance with some embodiments. The transistor device can be included within a semiconductor device. In some embodiments, the semiconductor device has a hybrid transistor structure. For example, the semiconductor device can be an LTPO device, and the transistor device can be an oxide transistor device (e.g., IGZO transistor device).

At block 310, a base structure is formed and, at block 320, a first gate structure and a buffer layer are formed on the base structure. The base structure can the base structure described above with reference to FIGS. 1-2. The first gate structure can include a first gate conductor. The first gate conductor can include any suitable conductive material (e.g., metal) in accordance with embodiments described herein. The buffer layer can include one or more dielectric layers. For example, the buffer layer can include one or more layers of an oxide material (e.g., $SiO_x$) and/or one or more layers of a nitride material (e.g., $Si_xN_y$). In some embodiments, the buffer layer includes a first layer of a first dielectric material and a second layer of a second dielectric material different from the first dielectric material. The first layer can be formed on the base structure, and the second layer can be formed on the first layer of the buffer layer. For example, the first layer can include a nitride material (e.g. $Si_xN_y$) and the second layer can include an oxide material (e.g., $SiO_x$). Further details regarding forming the base structure, the first gate structure, and the buffer layer are described above with reference to FIGS. 1-2.

At block 330, a semiconductor layer is formed. The semiconductor layer is used to form a channel region and a pair of source/drain regions. The semiconductor layer is formed on the buffer layer (e.g., the second layer of the buffer layer). Each source/drain region is formed at a respective end of the channel region. In some embodiments, the transistor device is a planar transistor device in which the source/drain regions and the channel region are arranged horizontally within the transistor device. In some embodiments, the transistor device is a vertical transistor device in which the source/drain regions and the channel region are arranged vertically within the transistor device.

The semiconductor layer can include any suitable material in accordance with embodiments described herein. In some embodiments, the semiconductor layer includes an oxide semiconductor material. For example, the semiconductor layer can include IGZO. Forming the semiconductor layer can include forming semiconductor material, and annealing the semiconductor material. For example, if the semiconductor material includes IGZO, annealing the semiconductor material can include heating the semiconductor material at about 230° C. for about 1 hour. Further details regarding forming the semiconductor layer are described above with reference to FIGS. 1-2.

At block 340, a second gate structure is formed. Forming the second gate structure can include forming a gate dielectric on the channel region and the source/drain regions and the buffer layer (e.g., the second layer of the buffer layer), and forming a second gate conductor on the gate dielectric. The gate dielectric can include any suitable dielectric material in accordance with embodiments described herein, and the second gate conductor can include any suitable conductive material (e.g., metal) in accordance with embodiments described herein. Forming the gate dielectric can further include, prior to forming the second gate conductor, annealing the dielectric material of the gate dielectric. For example, if the gate dielectric includes $SiO_x$, annealing the dielectric material of the gate dielectric can include heating the dielectric material of the gate dielectric at about 330° C. for about 1 hour. Forming the second gate conductor can further include forming a conductive material on the gate dielectric, and etching the conductive material. Further details regarding forming the second gate structure are described above with reference to FIGS. 1-2.

At block 350, the semiconductor material is doped. The doping can be performed to form a pair of source/drain regions. Doping refers to the process of introducing dopants as impurities into an intrinsic semiconductor to obtain an extrinsic semiconductor. For example, an opening can be created in the gate dielectric to expose respective portions of the semiconductor material. Doping can be used to adjust the threshold voltage of the transistor device. Doping the semiconductor layer can include performing ion implantation. In some embodiments, the semiconductor layer is doped with an n-type dopant to form an n-type semiconductor. An n-type semiconductor is an extrinsic semiconductor that is formed by doping an intrinsic semiconductor with electron donor atoms (e.g., the majority of charge carriers are electrons). In contrast, a p-type semiconductor is an extrinsic semiconductor that is formed by doping an intrinsic semiconductor with electron acceptor atoms (e.g., the majority of charge carriers are holes). For example, n+ doping can be performed, in which the "+" symbol denotes a high or heavy amount of doping (e.g., the number of dopant atoms added is on the order of one per ten thousand atoms). Doping the semiconductor material using an n+ doping process (e.g., ion implantation) can provide improvements with respect to hydrogen diffusion by, for example, increasing the diffusion path.

At block 360, a multi-layer ILD structure is formed. The multi-layer ILD structure can be formed on the second gate structure. The multi-layer ILD structure can include a dielectric stack having any suitable number of dielectric layers. For example, forming the multi-layer ILD structure can include forming a first dielectric layer on the second gate structure, and forming a second dielectric layer on the first dielectric layer. Each dielectric layer can have a set of sublayers. For example, the first dielectric layer can have a first sublayer and a second sublayer, and the second dielectric layer can have a third sublayer formed on the second sublayer. Each sublayer can be formed by depositing its respective dielectric material using a respective deposition rate, which affects the hydrogen concentration within the sublayer. For example, the first sublayer can be formed by depositing the first dielectric material using a first deposition rate, the second sublayer can be formed by depositing the first dielectric material using a second deposition rate lower than the first deposition rate, and the third sublayer can be formed by depositing the second dielectric material using a third deposition rate less than the first deposition rate (e.g., a deposition rate between the first deposition rate and the second deposition rate). Further details regarding forming the multi-layer ILD structure will be described below with reference to FIG. 3B.

At block 370, a pair of source/drain contacts are formed. Each source/drain contact is formed in electrical contact with a respective source/drain region of the pair of source/drain regions. Forming the source/drain contacts can include forming a pair of vias each in contact with a respective source/drain region of the pair of source/drain regions, and forming a pair of conductive layers (e.g., electrodes) each in contact with a respective via of the pair of vias. Forming the pair of vias can include forming a pair of holes to expose respective portions of the source/drain regions. The pair of holes can be performed using any suitable etch process. For example, the etch process can be a dry etch process (e.g., reactive-ion etching (RIE)).

Figure 3B:
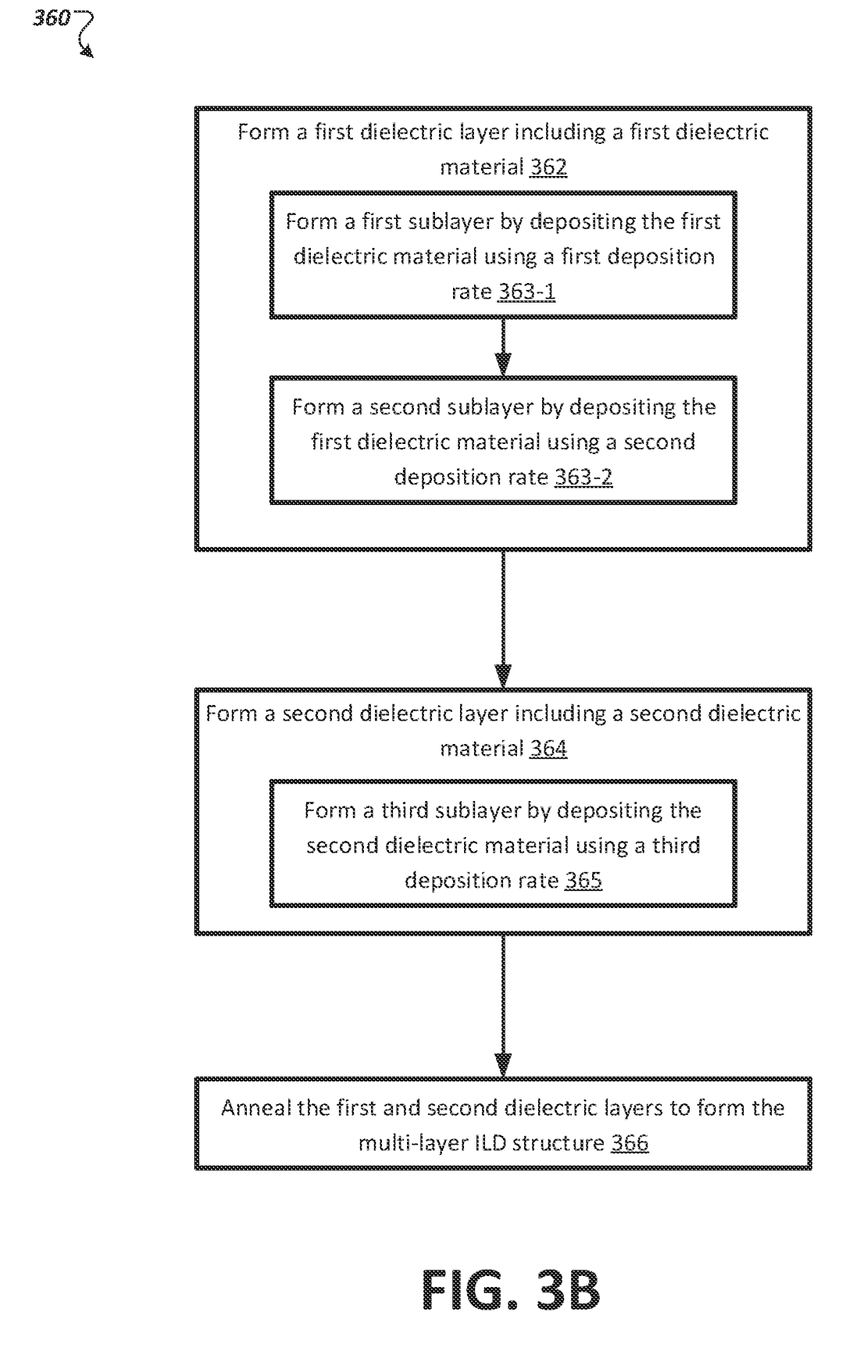

FIG. 3B depicts a flow chart of an example method for forming the multi-layer dielectric structure 360, in accordance with some embodiments. At block 362, a first dielectric layer including a first dielectric material is formed. The first dielectric layer can be formed on the second gate structure (e.g., on the gate conductor and the gate dielectric), and the second dielectric layer can be formed on the first dielectric layer. Forming the first dielectric layer at block 362 can include forming a first set of sublayers and forming the second dielectric layer can include forming a second set of sublayers. In some embodiments, the first dielectric material is an oxide dielectric material (e.g., each of the first and second sublayers is an oxide dielectric material layer). One example of an oxide dielectric material is silicon oxide ($SiO_x$). However, such embodiments should not be considered limiting, and any suitable dielectric material(s) can be used to form the first dielectric layer in accordance with the embodiments described herein.

For example, forming the first dielectric layer at block 362 can include, at block 363-1, forming a first sublayer by depositing the first dielectric material using a first deposition rate and, at block 363-2, forming a second sublayer by depositing the first dielectric material using a second deposition rate.

The first and second deposition rates can be different. More specifically, the second deposition rate can be lower than the first deposition rate. For example, the first deposition rate can be a high deposition rate (e.g., greater than or equal to about 1,500 Angstroms per minute), and the second deposition rate can be a low deposition rate (e.g., less than about 800 Angstroms per minute). The first deposition rate results in the first sublayer having a first hydrogen concentration, and the second deposition rate results in the second sublayer having a second hydrogen concentration. The first sublayer can be formed as a hydrogen diffusion source for the channel region (e.g., IGZO channel region), and the second sublayer can be formed as a hydrogen barrier. The first and second sublayers of the first set of sublayers can each be formed to have a thickness ranging from about 1,000 Angstroms to about 3,000 Angstroms.

As a hydrogen diffusion layer, the first sublayer ensures that the electrode/channel contact area has less contact resistance (e.g., more hydrogen diffusion on the channel layer can lead to a more conductive channel. As a hydrogen barrier layer, the second sublayer can act as a protection layer to block excess hydrogen sources from the second dielectric layer. For example, if the first dielectric material is silicon oxide and the second dielectric material is silicon nitride, silicon nitride can have at least 10 times the hydrogen content as compared to silicon oxide.

At block 364, a second dielectric layer including a second dielectric material is formed. In some embodiments, the second dielectric material is a nitride dielectric material (e.g., the third sublayer is a nitride dielectric material layer). One example of a nitride dielectric material is silicon nitride ($Si_xN_y$). However, such embodiments should not be considered limiting, and any suitable dielectric material can be used to form the second dielectric layer in accordance with the embodiments described herein.

Forming the second dielectric layer at block 364 can include, at block 365, forming a third sublayer by depositing the second dielectric material using a third deposition rate. The third deposition rate can be different from at least one of the first deposition rate or the second deposition rate. For example, the third deposition rate can be a medium deposition rate (e.g., between about 700 Angstroms per minute to about 1,500 Angstroms per minute). The third deposition rate results in the third sublayer having a third hydrogen concentration. For example, if the first dielectric material is silicon oxide and the second dielectric material is silicon nitride, silicon nitride can have at least 10 times the hydrogen content as compared to silicon oxide. The third sublayer can provide passivation ability with respect to, e.g., moisture, hydrogen diffusion, and/or ambient effects.

At block 366, the first and second dielectric layers are annealed to form the multi-layer ILD structure. Annealing the first and second dielectric layers can include performing inert gas annealing. For example, annealing the first and second dielectric layers can include heating the semiconductor material at about 365° C. for about 15 minutes using nitrogen gas ($N_2$). Further details regarding forming a multi-layer ILD structure of a transistor device are described above with reference to FIGS. 1-2.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A transistor device comprising:
   a base structure comprising a buffer layer disposed on a passivation layer, wherein the passivation layer comprises a polyimide material;
   a channel region disposed on the base structure;
   a first source/drain region adjacent to a first end of the channel region and a second source/drain region adjacent to a second end of the channel region;
   a gate structure disposed on the channel region, the first source/drain region and the second source/drain region; and
   an interlayer dielectric (ILD) structure disposed on the gate structure, the ILD structure comprising:

a first dielectric layer comprising a first set of sublayers, the first set of sublayers comprising a first sublayer comprising a first dielectric material having a first hydrogen concentration and a second sublayer comprising the first dielectric material having a second hydrogen concentration lower than the first hydrogen concentration; and a second dielectric layer comprising a second set of sublayers, the second set of sublayers comprising a third sublayer comprising a second dielectric material different from the first dielectric material.

2. The transistor device of claim 1, wherein the channel region comprises an oxide semiconductor material.

3. The transistor device of claim 2, wherein the channel region comprises indium gallium zinc oxide.

4. The transistor device of claim 1, wherein the first dielectric material comprises a silicon oxide material and the second dielectric material comprises a silicon nitride material.

5. The transistor device of claim 1, wherein:
the first hydrogen concentration results from the first sublayer being formed using a deposition process with a deposition rate greater than or equal to about 1,500 Angstroms per minute;
the second hydrogen concentration results from the second sublayer being formed using a deposition process with a deposition rate less than about 1,500 Angstroms per minute; and
the second dielectric material has a third hydrogen concentration resulting from the third sublayer being formed using a deposition process with a deposition rate between about 700 Angstroms per minute to about 1,500 Angstroms per minute.

6. The transistor device of claim 1, wherein the buffer layer comprises a third dielectric layer comprising a third dielectric material and a fourth dielectric layer comprising a fourth dielectric material different from the third dielectric material.

7. The transistor device of claim 1, further comprising a second gate structure disposed on the base structure.

8. The transistor device of claim 1, further comprising a first source/drain contact disposed on the first source/drain region and a second source/drain contact disposed on the second source/drain region.

9. A semiconductor device comprising:
a first transistor device;
a second transistor device; and
a capacitance storage device disposed between the first transistor device and the second transistor device;
wherein the first transistor device comprises:
a base structure comprising a buffer layer disposed on a passivation layer, wherein the passivation layer comprises a polyimide material;
a channel region disposed on the base structure;
a first source/drain region adjacent to a first end of the channel region and a second source/drain region adjacent to a second end of the channel region;
a gate structure disposed on the channel region, the first source/drain region and the second source/drain region; and
an interlayer dielectric (ILD) structure disposed on the gate structure, the ILD structure comprising:
a first dielectric layer comprising a first set of sublayers, the first set of sublayers comprising a first sublayer comprising a first dielectric material having a first hydrogen concentration and a second sublayer comprising the first dielectric material having a second hydrogen concentration lower than the first hydrogen concentration; and a second dielectric layer comprising a second set of sublayers, the second set of sublayers comprising a third sublayer comprising a second dielectric material different from the first dielectric material.

10. The semiconductor device of claim 9, wherein the channel region comprises an oxide semiconductor material, and wherein the second transistor device comprises a low-temperature polycrystalline silicon (LTPS) transistor device comprising a polycrystalline silicon (p-Si) channel region.

11. The semiconductor device of claim 9, wherein the first dielectric material comprises a silicon oxide material and the second dielectric material comprises a silicon nitride material.

12. The semiconductor device of claim 9, wherein:
the first hydrogen concentration results from the first sublayer being formed using a deposition process with a deposition rate greater than or equal to about 1,500 Angstroms per minute;
the second hydrogen concentration results from the second sublayer being formed using a deposition process with a deposition rate less than about 800 Angstroms per minute; and
the second dielectric material has a third hydrogen concentration resulting from the third sublayer being formed using a deposition process with a deposition rate between about 700 Angstroms per minute to about 1,500 Angstroms per minute.

13. The semiconductor device of claim 9, further comprising:
a second gate structure disposed on the base structure.

14. The semiconductor device of claim 9, wherein the buffer layer comprises a third dielectric layer comprising a third dielectric material and a fourth dielectric layer comprising a fourth dielectric material different from the third dielectric material.

15. The semiconductor device of claim 9, wherein the second transistor device further comprises an anode layer, and further comprising:
a set of planarization layers disposed on the ILD structure;
a first source/drain contact disposed on the first source/drain region and a second source/drain contact disposed on the second source/drain region, wherein the first and second source/drain contacts are formed through the set of planarization layers, the ILD structure and the gate structure;
a cathode layer disposed on the set of planarization layers;
a pixel definition layer disposed on the cathode layer and the set of planarization layers; and
an OLED layer disposed on the pixel definition layer.

16. The transistor device of claim 1, wherein the base structure further comprises a second passivation layer disposed on the buffer layer.

17. The transistor device of claim 16, wherein the base structure further comprises a second buffer layer disposed on the second passivation layer.

18. The semiconductor device of claim 9, wherein the base structure further comprises a second passivation layer disposed on the buffer layer.

19. The semiconductor device of claim 18, wherein the base structure further comprises a second buffer layer disposed on the second passivation layer.

* * * * *